(12) United States Patent
Kim et al.

(10) Patent No.: US 11,332,019 B2
(45) Date of Patent: May 17, 2022

(54) PHOTOVOLTAIC PANEL MOUNTING SYSTEM FOR A VEHICLE

(71) Applicants: HYUNDAI MOTOR COMPANY, Seoul (KR); KIA MOTORS CORPORATION, Seoul (KR)

(72) Inventors: Sol Kim, Suwon-si (KR); Sang Hak Kim, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 23 days.

(21) Appl. No.: 16/796,598

(22) Filed: Feb. 20, 2020

(65) Prior Publication Data

US 2021/0053447 A1    Feb. 25, 2021

(30) Foreign Application Priority Data

Aug. 20, 2019    (KR) .................. 10-2019-0101843

(51) Int. Cl.
*B60L 8/00*     (2006.01)
*H01L 31/02*    (2006.01)
(Continued)

(52) U.S. Cl.
CPC ........ *B60L 8/003* (2013.01); *H01L 31/02013* (2013.01); *H02S 20/30* (2014.12);
(Continued)

(58) Field of Classification Search
CPC ...... B60L 8/003; B60L 8/00; H01L 31/02013; H02S 20/30; H02S 40/34; H02S 40/36;
(Continued)

(56) References Cited

U.S. PATENT DOCUMENTS 5,154,481 A * 10/1992 Paetz ................. B60H 1/00428
                                                    296/211
6,155,635 A * 12/2000 Wecker .................... B60J 7/003
                                                    296/211
(Continued)

FOREIGN PATENT DOCUMENTS

KR    200474466 Y1    9/2014
KR    101637717 B1    7/2016
(Continued)

*Primary Examiner* — Michael Y Sun
(74) *Attorney, Agent, or Firm* — Lempia Summerfield Katz LLC

(57) ABSTRACT

A photovoltaic (PV) panel mounting system for a vehicle includes: a PV panel movably mounted on a vehicle panel; a first electrode electrically connected to the PV panel; a second electrode attached to the vehicle panel and electrically connected to the first electrode; and a damping mechanism elastically supporting the PV panel with respect to the vehicle panel. The damping mechanism allows the PV panel to move between a first position and a second position. The first position refers to a position in which an outer surface of the PV panel is flush with an outer surface of the vehicle panel and the second position refers to a position in which the outer surface of the PV panel is recessed from the outer surface of the vehicle panel.

11 Claims, 3 Drawing Sheets

(51) Int. Cl.
*H02S 20/30* (2014.01)
*H02S 20/32* (2014.01)
*H02S 30/20* (2014.01)
*E05B 15/14* (2006.01)
*E04F 21/18* (2006.01)
*G02C 5/22* (2006.01)

(52) U.S. Cl.
CPC .............. *B60L 8/00* (2013.01); *E04F 21/1805* (2013.01); *E05B 15/143* (2013.01); *G01N 2203/0292* (2013.01); *G02C 5/2227* (2013.01); *G02C 5/2236* (2013.01); *H02S 20/32* (2014.12); *H02S 30/20* (2014.12)

(58) Field of Classification Search
CPC .......... H02S 30/10; H02S 40/30; H02S 20/32; H02S 30/20; B60K 16/00; B60K 2016/003; B60R 16/02; B60Y 2410/13; E04F 21/1805; E05B 15/143; G01N 2203/0292; G02C 5/2227; G02C 5/2236; Y02E 10/50; Y02T 10/7072
See application file for complete search history.

(56) References Cited

U.S. PATENT DOCUMENTS

| | | | |
|---|---|---|---|
| 6,485,090 | B1 | 11/2002 | Paetz et al. |
| 8,348,336 | B2 | 1/2013 | De Bie |
| 9,573,449 | B2 | 2/2017 | Park |
| 9,579,957 | B2 | 2/2017 | Park et al. |
| 9,641,124 | B2 | 5/2017 | Eo |
| 2012/0048349 | A1* | 3/2012 | Metin .................... H02S 40/34 136/251 |
| 2016/0126886 | A1 | 5/2016 | Eo |
| 2018/0166601 | A1* | 6/2018 | Inaba .................. H01L 31/0508 |
| 2020/0207213 | A1 | 7/2020 | Kim |

FOREIGN PATENT DOCUMENTS

| KR | 101767340 B1 | 8/2017 |
|---|---|---|
| KR | 20200079915 | 7/2020 |

* cited by examiner

PHOTOVOLTAIC PANEL MOUNTING SYSTEM FOR A VEHICLE

CROSS-REFERENCE TO RELATED APPLICATION

This application is based on and claims the benefit of priority to Korean Patent Application No. 10-2019-0101843, filed on Aug. 20, 2019, in the Korean Intellectual Property Office, the disclosure of which is incorporated herein in its entirety by reference.

TECHNICAL FIELD

The present disclosure relates to a photovoltaic (PV) panel mounting system for a vehicle.

BACKGROUND

In recent years, vehicle electrification has seen remarkable progress, due in part to environmental regulations on zero-emission vehicles. To implement vehicle electrification, vehicles have various electronic systems, electronic components, and the like, which increase the required power of such vehicles.

Accordingly, technologies for mounting auxiliary power sources, in addition to a main power source such as a vehicle main battery, on vehicles are being researched and developed. One such technology is a photovoltaic (PV) panel mounted on the vehicle. The PV panel may be mounted on a vehicle panel exposed to the outside, such as a bonnet, a trunk door, or a roof.

According to the related art, the PV panel is mounted on the surface of the vehicle panel, and is electrically connected to a vehicle charger, a vehicle battery, and various electronic systems through electrically conductive wires. In this case, however, the manufacturing method is complicated. Also, a narrow interior space of the vehicle panel makes the connections of the conductive wires very inefficient.

Of the vehicle panels, the bonnet is subject to a relatively high probability of collision with pedestrians. If the PV panel is mounted on the bonnet, severe physical injury and electric shock may occur when a pedestrian collides with a vehicle body. For example, when glass-based packaging is applied to the PV panel, it may reduce pedestrian safety. Accordingly, the PV panel mounted on the bonnet does not employ glass-based packaging materials, which results in a limitation on material selection. In addition, there is a high risk of accidental electric shock if a pedestrian collides directly with the PV panel.

The above information described in this background section is provided to assist in understanding the background of the inventive concept. The background section may include any technical concept which is not considered as the prior art that is already known to those having ordinary skill in the art.

SUMMARY

The present disclosure has been made to solve the above-mentioned problems occurring in the prior art while advantages achieved by the prior art are maintained intact.

An aspect of the present disclosure is to provide a photovoltaic (PV) panel mounting system for a vehicle capable of simplifying electrical connection between a PV panel and a vehicle panel. Another aspect is to elastically support the PV panel and block the electrical connection when an external force is applied to the PV panel.

According to an aspect of the present disclosure, a PV panel mounting system for a vehicle may include: a PV panel movably mounted on a vehicle panel; a first electrode electrically connected to the PV panel; a second electrode attached to the vehicle panel and electrically connected to the first electrode; and a damping mechanism elastically supporting the PV panel with respect to the vehicle panel. The damping mechanism may allow the PV panel to move between a first position and a second position. The first position may refer to a position in which an outer surface of the PV panel is flush with an outer surface of the vehicle panel. The second position may refer to a position in which the outer surface of the PV panel is recessed from the outer surface of the vehicle panel.

The damping mechanism may include: a support member having a head portion and a rod extending from the head portion; a receiving member having a receiving space in which the rod is movably received; and a spring disposed around the rod, and the spring may be interposed between the PV panel and the receiving member.

The PV panel mounting system may further include an electrode support block configured to block electrical connection between the first electrode and the second electrode when the PV panel is moved to the second position by an external force.

The electrode support block may be made of a non-conductive material. The electrode support block may be mounted on an edge of the PV panel and support the first electrode and the second electrode.

The first electrode may be electrically connected to the PV panel through a wire and the wire may be embedded into the electrode support block.

The electrode support block may include a first surface to which the first electrode is attached, a second surface disposed above the first surface, and a guide surface connecting the first surface and the second surface. The first surface, the second surface, and the guide surface may face the second electrode.

The first surface and the second surface may be inclined in different directions, and the guide surface may obliquely connect the first surface and the second surface.

The second electrode may include a base portion attached to the vehicle panel, and an electrode tab connected to the base portion through an elastic deformation portion, and the electrode tab may be configured to selectively contact the first electrode according to movement of the PV panel.

The elastic deformation portion may be elastically deformed between the base portion and the electrode tab.

The elastic deformation portion may have an apex, and first and second elastic legs extending from the apex in different directions, and the first and second elastic legs may be elastically deformed with respect to the apex as the PV panel moves.

The first elastic leg may connect the base portion to the apex, and the second elastic leg may connect the apex to the electrode tab.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
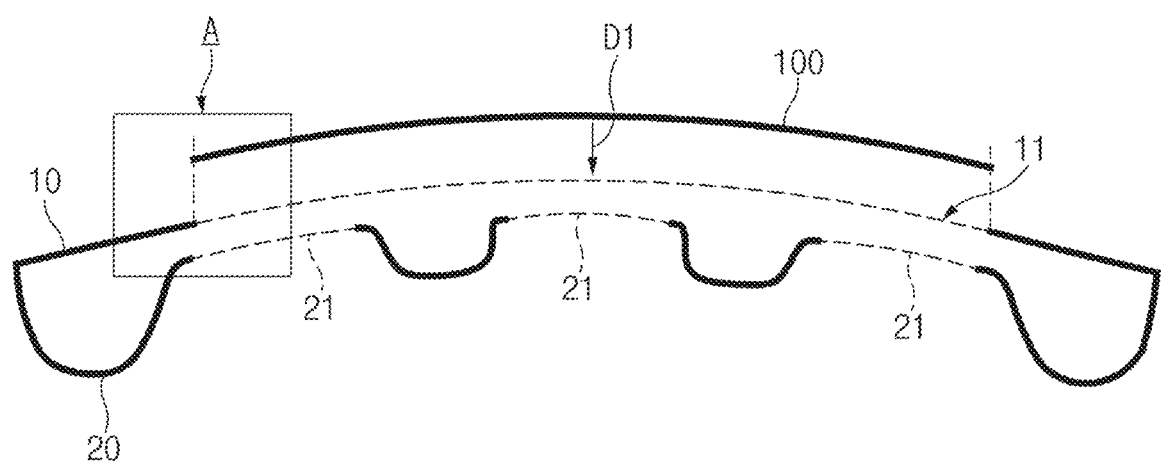
FIG. 1 illustrates a longitudinal sectional view of a photovoltaic (PV) panel mounting system for a vehicle according to an embodiment of the present disclosure and a vehicle panel assembly including the same.

Hereinafter, embodiments of the present disclosure are described in detail with reference to the accompanying drawings. In the drawings, the same reference numerals are used throughout to designate the same or equivalent elements. In addition, a detailed description of well-known techniques associated with the present disclosure have been omitted in order not to unnecessarily obscure the gist of the present disclosure.

Terms such as first, second, A, B, (a), and (b) may be used to describe the elements in embodiments of the present disclosure. These terms are only used to distinguish one element from another element. The intrinsic features, sequence or order, and the like of the corresponding elements are not limited by the terms. When a component is mentioned as being "connected" to or "accessing" another component, this may mean that it is directly connected to or accessing the other component, but it is to be understood that another component may exist therebetween. Unless otherwise defined, all terms used herein, including technical or scientific terms, have the same meanings as those generally understood by those with ordinary knowledge in the field of art to which the present disclosure belongs. Such terms as those defined in a generally used dictionary are to be interpreted as having meanings equal to the contextual meanings in the relevant field of art. Such terms are not to be interpreted as having ideal or excessively formal meanings unless clearly defined as having such in the present application.

FIG. 1 illustrates a sectional view of a vehicle panel assembly including a photovoltaic (PV) module according to an embodiment of the present disclosure.

Referring to FIG. 1, the vehicle panel assembly according to an embodiment of the present disclosure may include an outer panel 10, an inner panel 20, and a PV panel 100.

The outer panel 10 may face an exterior space of the vehicle, and the inner panel 20 may face an interior space of the vehicle. The outer panel 10 and the inner panel 20 may be coupled to define a cavity therein. The outer panel 10 and the inner panel 20 may be formed of a conductor such as a steel sheet having adequate strength and stiffness.

The outer panel 10 may have a mounting opening 11 in which the PV panel 100 is movably mounted.

The inner panel 20 may have a plurality of openings 21 to strengthen or improve structural stiffness. For example, the openings 21 in the inner panel 20 may be formed in a circular hole shape.

Figure 2:
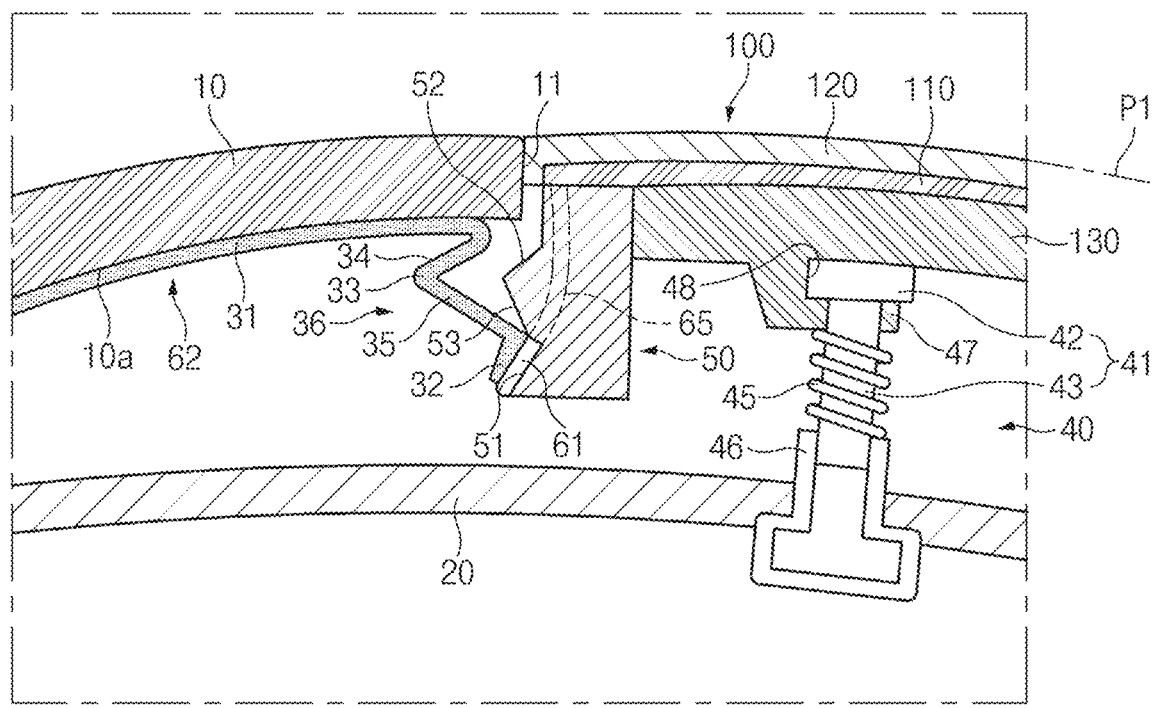
FIG. 2 illustrates an enlarged view of portion A in FIG. 1 in a state in which a PV panel is mounted on a vehicle panel.

The PV panel 100 may be movably mounted in the mounting opening 11 of the outer panel 10 along a first direction D1. Referring to FIG. 2, the PV panel 100 may include a PV module 110 in which a plurality of PV cells is electrically connected. The PV panel 100 may also include a protective layer 120 protecting an outer surface of the PV module 110 and may include a support layer 130 supporting an inner surface of the PV module 110. The outer surface of the PV module 110 refers to a surface of the PV module 110 exposed to the sun, and the inner surface of the PV module 110 refers to a surface of the PV module 110 opposing the outer surface thereof. The protective layer 120 and the support layer 130 may be made of an insulating or non-conductive material, and the protective layer 120 may be made of a transparent material.

The PV panel 100 may move along the first direction D1 depending on whether an external force F is applied to the PV panel 100. In particular, the PV panel 100 may move between a first position P1 (FIG. 2) and a second position P2 (FIG. 3) by the force F and an elastic restoring force of a spring 45. The first position P1 refers to a position in which the outer surface of the PV panel 100 (that is, an outer surface of the protective layer 120) is flush with or adjacent to an outer surface of the outer panel 10 of the vehicle panel under the condition that the force F is not applied to the PV panel 100 (see FIG. 2). The second position P2 refers to a position in which the outer surface of the PV panel 100 (that is, the outer surface of the protective layer 120) is recessed from the outer surface of the outer panel 10 of the vehicle panel toward the inner panel 20 under the condition that the force F is applied to the PV panel 100 (see FIG. 3).

According to an embodiment of the present disclosure, the PV panel 100 may be buffered and supported with respect to the vehicle panel by a damping mechanism 40. The damping mechanism 40 may allow the PV panel 100 to return from the second portion P2 to the first position P1. In particular, the damping mechanism 40 may allow the PV panel 100 to move between the first position P1 and the second position P2. For example, the damping mechanism 40 may allow the PV panel 100 to move to the second position P2 in which the PV panel 100 is recessed from the outer surface of the vehicle panel when the external force is applied to the PV panel 100. The damping mechanism 40 may also allow the PV panel 100 to return to the first position P1 in which the PV panel 100 is flush with the outer surface of the vehicle panel due to the elastic force when the external force is removed.

The damping mechanism 40 may include a support member 41, a receiving member 46, and the spring 45.

The support member 41 may include a head portion 42 and a rod 43 extending from the head portion 42. The head portion 42 may be fixed to the support layer 130 of the PV panel 100. The PV panel 100 may have a protrusion 47 formed on a bottom surface of the support layer 130. The protrusion 47 may define a recess 48 to which the head portion 42 is coupled. As the head portion 42 of the support member 41 is coupled to the recess 48, the support member 41 may move together with the PV panel 100. The rod 43 may extend from the head portion 42 toward the inner panel 20. In particular, the rod 43 may extend through the protrusion 47 toward the inner panel 20.

The receiving member 46 may be fixed to the inner panel 20 and may have a space for receiving the rod 43 of the support member 41. The receiving space of the receiving member 46 may have a length and a diameter sufficient to receive the rod 43 moving together with the PV panel 100.

Figure 3:
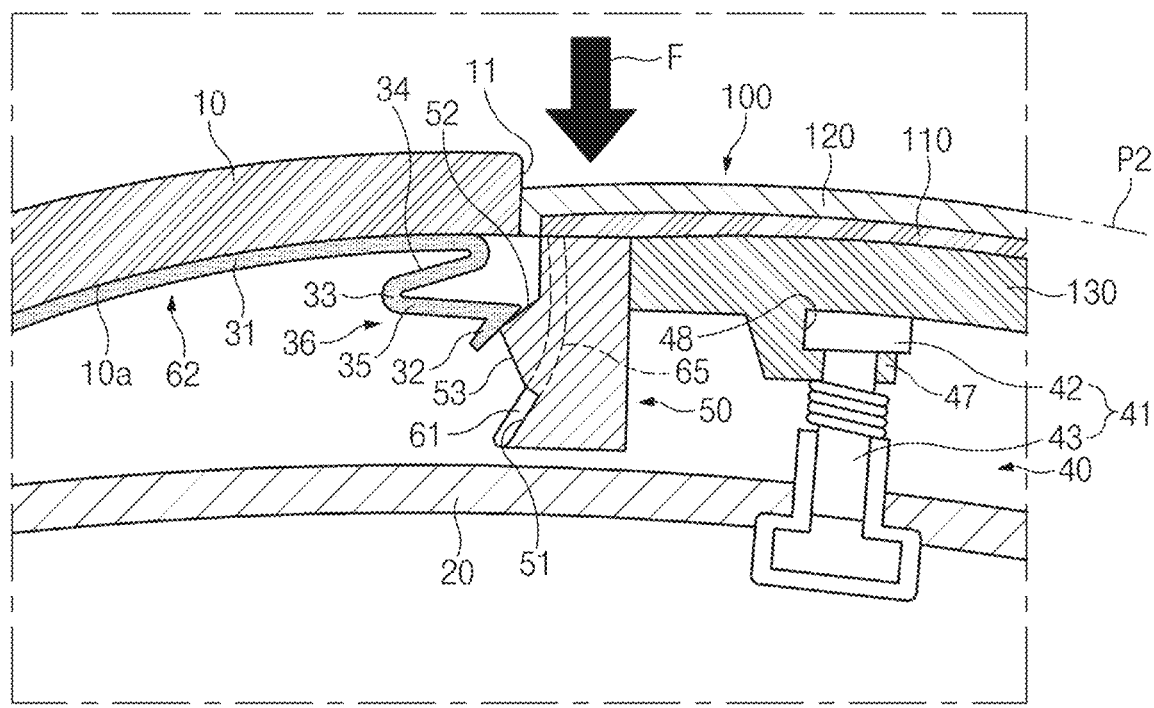
FIG. 3 illustrates a state in which an external force is applied to the PV panel in FIG. 2.

The spring 45 may be disposed around the rod 43 to elastically or dampingly support the PV panel 100 so that the spring 45 may be extended or compressed in a longitudinal direction of the rod 43. The spring 45 may be interposed between the PV panel 100 and the receiving member 46. In detail, a top end of the spring 45 may contact the protrusion 47 of the PV panel 100, and a bottom end of the spring 45 may contact a top end of the receiving member 46. As illustrated in FIG. 2, when the external force F is not applied to the PV panel 100, the spring 45 may be extended, and the PV panel 100 may move to the first position P1 due to the elastic force of the spring 45. As illustrated in FIG. 3, when the external force F is applied to the PV panel 100, the spring 45 may be compressed, and the PV panel 100 may move to the second position P2.

The damping mechanism may elastically or dampingly support the PV panel with respect to the vehicle panel to alleviate external shock applied to the PV panel. The PV panel may easily return to its original position due to the restoring force of the damping mechanism when the external force applied to the PV panel is removed. This may ensure the safety of pedestrians and eliminate limitations on packaging materials applied to the PV panel, thereby providing high quality and high productivity.

Referring to FIGS. 2 and 3, a first electrode 61 may be connected to the PV panel 100 through a conductive wire 65, and a second electrode 62 may be attached to the outer panel 10. The second electrode 62 may be electrically connected to the first electrode 61.

An electrode support block 50 may be mounted on an edge of the PV panel 100, and the electrode support block 50 may support the first electrode 61 and the second electrode 62. In one example, the electrode support block 50 may be fixed to an edge of the support layer 130 of the PV panel 100 or may be integrally connected to the support layer 130. The electrode support block 50 may be made of an insulating or non-conductive material. The electrode support block 50 may protrude from the edge of the support layer 130 toward the inner panel 20. The electrode support block 50 may support the conductive wire 65 extending from the PV panel 100, the first electrode 61, and the second electrode 62.

When the PV panel 100 moves to the first position P1 due to the elastic force of the damping mechanism 40, the electrode support block 50 may be configured to maintain electrical connection between the first electrode 61 and the second electrode 62. Specifically, as illustrated in FIG. 2, when the PV panel 100 moves to the first position P1, a bottom end of the electrode support block 50 may move upwardly so as to be spaced apart from the inner panel 20 of the vehicle panel by a predetermined distance. The first electrode 61 of the PV panel 100 may then be connected to the second electrode 62 of the outer panel 10.

When the PV panel 100 is in the second position P2 due to the external force, the electrode support block 50 may be configured to block the electrical connection between the first electrode 61 and the second electrode 62. Specifically, as illustrated in FIG. 3, when the PV panel 100 moves to the second position P2, the bottom end of the electrode support block 50 may move downwardly so as to relatively approach or come into contact with the inner panel 20 of the vehicle panel. The first electrode 61 of the PV panel 100 may then not be connected to the second electrode 62 of the outer panel 10.

The first electrode 61 may be electrically connected to the PV module 110 through the conductive wire 65. The conductive wire 65 may extend from the PV module 110, and the first electrode 61 may extend from the conductive wire 65. In one example, the conductive wire 65 extending from the PV panel 100 may be inserted or embedded into the electrode support block 50, and the first electrode 61 may be connected to an end of the conductive wire 65.

Referring to FIG. 2, the electrode support block 50 may include a first surface 51 to which the first electrode 61 is attached, a second surface 52 disposed above the first surface 51, and a guide surface 53 connecting the first surface 51 and the second surface 52. The first surface 51, the second surface 52, and the guide surface 53 may be positioned to face the second electrode 62. The first surface 51 and the second surface 52 may be inclined in different directions or orientations, and the guide surface 53 may obliquely connect a top edge of the first surface 51 and a bottom edge of the second surface 52.

As the first electrode 61 is attached to the first surface 51, the first surface 51 may be a conductive area. The second surface 52 and the guide surface 53 may be a non-conductive area.

According to an embodiment, the conductive wire 65 may be inserted or embedded into the electrode support block 50 so that the conductive wire 65 may not be exposed to the outside of the electrode support block 50. The first electrode 61 may be attached to the first surface 51 of the electrode support block 50 so that the first electrode 61 may be exposed to the outside of the electrode support block 50.

The second electrode 62 may include a base portion 31 attached to the outer panel 10 of the vehicle panel, and an electrode tab 32 connected to an end of the base portion 31 through an elastic deformation portion 36. The base portion 31, the elastic deformation portion 36, and the electrode tab 32 may be made of a conductive material.

The base portion 31 may be attached to an inner surface 10a of the outer panel 10. One end of the base portion 31 may be electrically connected to the electrode tab 32 through the elastic deformation portion 36. The other end of the base portion 31 may be connected to a vehicle charger, a vehicle battery, a variety of electronic systems, and the like.

The elastic deformation portion 36 may be elastically deformed between the base portion 31 and the electrode tab 32. The elastic deformation portion 36 may have an apex 33, and first and second elastic legs 34 and 35 may extend from the apex 33 in different directions. The first elastic leg 34 may connect one end of the base portion 31 to the apex 33, and the second elastic leg 35 may connect the apex 33 to the electrode tab 32. The first elastic leg 34 and the second elastic leg 35 may be elastically deformed with respect to the apex 33 so that an angle of intersection between the first elastic leg 34 and the second elastic leg 35 may vary according to the movement of the PV panel 100. For example, when the PV panel 100 is in the first position P1, the first and second elastic legs 34 and 35 may be relatively spread wide apart with respect to the apex 33 so that the angle of intersection between the first elastic leg 34 and the second elastic leg 35 may be a maximum angle of intersection. When the PV panel 100 is in the second position P2, the first and second elastic legs 34 and 35 may be relatively closed with respect to the apex 33 so that the angle of intersection between the first elastic leg 34 and the second elastic leg 35 may be a minimum angle of intersection.

The maximum angle of intersection between the first elastic leg 34 and the second elastic leg 35 may be less than an angle between the second surface 52 and the guide surface 53 of the electrode support block 50. Thus, the elastic deformation portion 36 may be easily deformed as the PV panel 100 moves. The contact between the electrode tab 32 and the first electrode 61 may be stably maintained when the PV panel 100 is in the first position P1.

The electrode tab 32 may be connected to the elastic deformation portion 36 to be elastically deformed. In one example, the electrode tab 32 may be bent with respect to the second elastic leg 35 of the elastic deformation portion 36 at a predetermined angle. When the PV panel 100 moves from the second position P2 to the first position P1, the electrode tab 32 may move from the second surface 52 to the first surface 51 along the guide surface 53 so that the first elastic leg 34 and the second elastic leg 35 of the elastic deformation portion 36 may be spread wide apart. The electrode tab 32 may thus be directly brought into contact with the first electrode 61. When the PV panel 100 moves from the first position P1 to the second position P2, the electrode tab 32 may move from the first surface 51 to the second surface 52 along the guide surface 53 so that the first elastic leg 34 and the second elastic leg 35 of the elastic deformation portion 36 may be closed. The electrode tab 32 may thus be brought into contact with the second surface 52 of the electrode support block 50, which is the non-conductive area, whereby the electrical connection between the second electrode 62 and the first electrode 61 may be blocked.

Meanwhile, each of the first surface 51, the second surface 52, and the guide surface 53 may have an inclined angle that does not interfere with the movement of the electrode tab 32.

The electrode support block may be provided on the edge of the PV panel. The electrode support block may block the electrical connection between the first electrode of the PV panel and the second electrode of the vehicle panel when the PV panel moves toward the inside of the vehicle panel by the external force. The electrode support block thereby prevents electric shock accidents from happening.

As set forth above, according to embodiments of the present disclosure, the damping mechanism may elastically or dampingly support the PV panel with respect to the vehicle panel to alleviate external shock applied to the PV panel. The PV panel may easily return to its original position due to the restoring force of the damping mechanism when the external force applied to the PV panel is removed. This may ensure the safety of pedestrians and eliminate limitations on packaging materials applied to the PV panel, thereby providing high quality and high productivity.

According to embodiments of the present disclosure, the electrode support block provided on the edge of the PV panel may block the electrical connection between the first electrode of the PV panel and the second electrode of the vehicle panel when the PV panel moves toward the inside of the vehicle panel by the external force. The electrode support block thereby prevents electric shock accidents from happening.

Hereinabove, although the present disclosure has been described with reference to embodiments and the accompanying drawings, the present disclosure is not limited thereto. Instead, the embodiments may be variously modified and altered by those having ordinary skill in the art to which the present disclosure pertains without departing from the spirit and scope of the present disclosure claimed in the following claims.

What is claimed is:

1. A photovoltaic (PV) panel mounting system for a vehicle, the PV panel mounting system comprising:
    a vehicle panel including an outer panel facing an exterior space of the vehicle, and an inner panel facing an interior space of the vehicle;
    a PV panel including a PV module and a support layer supporting an inner surface of the PV module;
    a first electrode electrically connected to the PV panel;
    a second electrode attached to the vehicle panel;
    a damping mechanism elastically supporting the PV panel with respect to the vehicle panel; and
    an electrode support block supporting the first electrode and the second electrode,
    wherein the electrode support block protrudes from an edge of the support layer toward the inner panel,
    wherein the damping mechanism allows the PV panel to move between a first position and a second position,
    wherein the first position is a position making an electrical connection between the first electrode and the second electrode, and
    wherein the second position is a position breaking the electrical connection between the first electrode and the second electrode.

2. The PV panel mounting system according to claim 1, wherein the damping mechanism includes:
    a support member having a head portion and a rod extending from the head portion;
    a receiving member having a receiving space in which the rod is movably received; and
    a spring disposed around the rod, the spring being interposed between the PV panel and the receiving member.

3. The PV panel mounting system according to claim 1, wherein the electrode support block is configured to block electrical connection between the first electrode and the second electrode when the PV panel is moved to the second position by an external force.

4. The PV panel mounting system according to claim 3, wherein the electrode support block is made of a non-conductive material.

5. The PV panel mounting system according to claim 4, wherein the first electrode is electrically connected to the PV panel through a wire, and wherein the wire is embedded into the electrode support block.

6. The PV panel mounting system according to claim 5, wherein the electrode support block includes a first surface to which the first electrode is attached, a second surface disposed above the first surface, and a guide surface connecting the first surface and the second surface, and
    wherein the first surface, the second surface, and the guide surface face the second electrode.

7. The PV panel mounting system according to claim 6, wherein the first surface and the second surface are inclined in different directions, and wherein the guide surface obliquely connects the first surface and the second surface.

8. The PV panel mounting system according to claim 7, wherein the second electrode includes a base portion attached to the vehicle panel and an electrode tab connected to the base portion through an elastic deformation portion, and
    wherein the electrode tab is configured to selectively contact the first electrode according to movement of the PV panel.

9. The PV panel mounting system according to claim 8, wherein the elastic deformation portion is elastically deformed between the base portion and the electrode tab.

10. The PV panel mounting system according to claim 9, wherein the elastic deformation portion has an apex and first and second elastic legs extend from the apex in different directions, and
    wherein the first and second elastic legs are elastically deformed with respect to the apex as the PV panel moves.

11. The PV panel mounting system according to claim 10, wherein the first elastic leg connects the base portion to the apex, and wherein the second elastic leg connects the apex to the electrode tab.

* * * * *